United States Patent
Taylor et al.

(10) Patent No.: US 7,324,342 B2
(45) Date of Patent: Jan. 29, 2008

(54) ELECTRONICS ASSEMBLY AND ELECTRONICS PACKAGE CARRIER THEREFOR

(75) Inventors: Ralph S. Taylor, Noblesville, IN (US); Thomas A. Degenkolb, Noblesville, IN (US); Loren H. Rasmussen, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 92 days.

(21) Appl. No.: 11/253,858

(22) Filed: Oct. 19, 2005

(65) Prior Publication Data

US 2007/0086163 A1 Apr. 19, 2007

(51) Int. Cl.
*H05K 7/20* (2006.01)
*F28D 15/00* (2006.01)

(52) U.S. Cl. .............. 361/704; 361/702; 361/719; 165/104.33; 165/185; 174/15.1

(58) Field of Classification Search ........ 361/699–704, 361/715, 719, 968, 709–710; 174/16.3, 15.1, 174/252; 257/714, 723–727; 165/80.3, 165/104.33, 195; 439/71, 331, 485, 497; 248/27.3, 221.11, 222.12, 632, 634
See application file for complete search history.

(56) References Cited

U.S. PATENT DOCUMENTS

| | | | | |
|---|---|---|---|---|
| 4,707,726 A | * | 11/1987 | Tinder | 174/252 |
| 5,006,792 A | * | 4/1991 | Malhi et al. | 324/762 |
| 5,073,117 A | * | 12/1991 | Malhi et al. | 439/71 |
| 6,633,485 B1 | * | 10/2003 | Sigl et al. | 361/718 |
| 6,639,798 B1 | | 10/2003 | Jeter et al. | |
| 6,812,553 B2 | | 11/2004 | Gerbsch et al. | |
| 6,826,052 B2 | * | 11/2004 | Ma | 361/709 |
| 6,865,080 B2 | * | 3/2005 | Radosevich et al. | 361/699 |
| 6,934,153 B2 | * | 8/2005 | Lee et al. | 361/697 |
| 2002/0181206 A1 | * | 12/2002 | Isenburg | 361/720 |
| 2004/0094828 A1 | | 5/2004 | Campbell et al. | |
| 2004/0188080 A1 | * | 9/2004 | Gailus et al. | 165/185 |
| 2004/0252461 A1 | * | 12/2004 | Wu | 361/704 |
| 2005/0077614 A1 | | 4/2005 | Chengalva et al. | |
| 2005/0111191 A1 | * | 5/2005 | Lee et al. | 361/704 |
| 2006/0133038 A1 | * | 6/2006 | Yu et al. | 361/697 |
| 2006/0171125 A1 | * | 8/2006 | Yu et al. | 361/710 |

* cited by examiner

*Primary Examiner*—Jayprakash Gandhi
*Assistant Examiner*—Robert J Hoffberg
(74) *Attorney, Agent, or Firm*—Jimmy L. Funke

(57) ABSTRACT

An electronics assembly is provided having a carrier that provides a controlled height variability between electronics packages and a heat sink device. The electronics assembly includes a substrate and electronics packages connected to the substrate. The assembly also includes a heat sink device positioned in thermal communication with a first side of the electronics packages. The assembly further includes a carrier disposed between the substrate and the heat sink device. The carrier has a resilient wall that biases the electronics packages towards the heat sink device such that a controlled bond line is provided between the first side of the electronics packages and the heat sink device.

18 Claims, 3 Drawing Sheets

ELECTRONICS ASSEMBLY AND ELECTRONICS PACKAGE CARRIER THEREFOR

TECHNICAL FIELD

The present invention generally relates to electronics assemblies and, more particularly, relates to an electronics assembly having a thermal cooling device and a carrier for orienting electronics devices(s) relative to the cooling device.

BACKGROUND OF THE INVENTION

Power electronics devices employ electronics packages (devices) that generally contain electrical circuitry for conducting electrical current which, in turn, generates thermal energy (i.e., heat). Automotive high-power electronics, such as those employed in electric and hybrid-electric vehicles typically generate a significant amount of thermal energy during operation. Excessive heat build-up may cause reduced performance including electrical circuit failure. Thus, thermal energy must be dissipated and transferred away from the electronics to ensure proper operation of the assembly. Additionally, the power capability of the electronics package(s) and size of the electronics assembly generally depend upon the amount of heat dissipation that may be achieved.

For very high-power applications, such as electronics packages used in hybrid-electric or electric vehicles, enhanced cooling of electronics may be required. U.S. Pat. No. 6,639,798 discloses an automotive electronics heat exchanger employing a heat sink device having a fluid vessel in fluid communication with an automotive radiator. The heat sink device is positioned in thermal communication with one side of an electronics power package such that fluid coolant flows through the heat sink device to cool the electronics package. The entire disclosure of U.S. Pat. No. 6,639,798 is hereby incorporated herein by reference.

When orienting the electronics package(s) relative to the heat sink device, conventional assembly approaches generally suffer in that the distance between the heat sink device and the cooling surface of the power electronics package(s) is variable. This variability in distance between discrete power packages and the heat sink device can adversely affect the thermal performance of the power electronics assembly.

Discrete electronics packages are typically wave soldered onto the circuit board. The height of the cooling surface of the discrete power packages with respect to the circuit board generally varies due to process variations and material tolerances. Placing a heat sink (e.g., rail) with a thermal interface material onto the cooling surface of the discrete power package(s), at this stage of the process, generally creates a variable bond line for the thermal interface material. This variable bond line may cause large thermal losses in the power electronics stack which results in less effective cooling. The power stack in a typical assembly is generally defined as the material layers between the circuit board substrate (die) and the cooling fluid, which may include the die, solder, direct bond copper aluminium nitride (AlN), thermal interface material, and heat sink device (rail) with coolant.

Conventional mechanical methods of forcing the discrete power package(s) against the heat sink, once it has been soldered onto the substrate to reduce these variations, typically produce large amounts of stress and deformation in the power package leads. Additionally, applying force generally requires the addition of a spring or durometer material in conjunction with a hole, to be placed in the circuit board. Further, if a grease or adhesive is used between the heat sink device and the discrete power packages, the variable bond line can produce excess material that flows onto other areas of the assembly, possibly causing electrical shorts.

It is therefore desirable to provide for an enhanced electronics assembly that minimizes thermal losses in the power stack for electronics package(s) mounted onto a substrate in thermal communication with a heat sink device. In particular, it is desirable to control package height variability between electronics package(s) and the heat sink device to achieve a cost affordable and enhanced cooling of electronics, such as those employed in high-power electronics packages on an automotive vehicle.

SUMMARY OF THE INVENTION

According to one aspect of the present invention, an electronics assembly is provided having a carrier that provides a controlled height variability between an electronics package and a heat sink device. The electronics assembly includes a substrate and at least one electronics package connected to the substrate. The electronics package has electrical circuitry and first and second sides. The electronics assembly also includes a heat sink device positioned in thermal communication with the first side of the electronics package. The electronics assembly further includes a carrier disposed between the substrate and the heat sink device. The carrier has a resilient wall for biasing the electronics package towards the heat sink device such that a controlled bond line is provided between the first side of the electronics package and the heat sink device.

According to another aspect of the present invention, a carrier for use in an electronics assembly is provided. The carrier includes a frame generally defining at least one area for receiving an electronics package. The electronics package connects to a circuit board on a first side and is in thermal communication with a heat sink device on an opposite second side. The carrier also has a resilient wall at the at least one area for biasing the electronics package towards a heat sink device. The carrier further has connecting members adapted to engage a member of the electronics assembly. The connecting members hold the electronics package in a desired orientation relative to the heat sink device such as to provide a controlled bond line.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
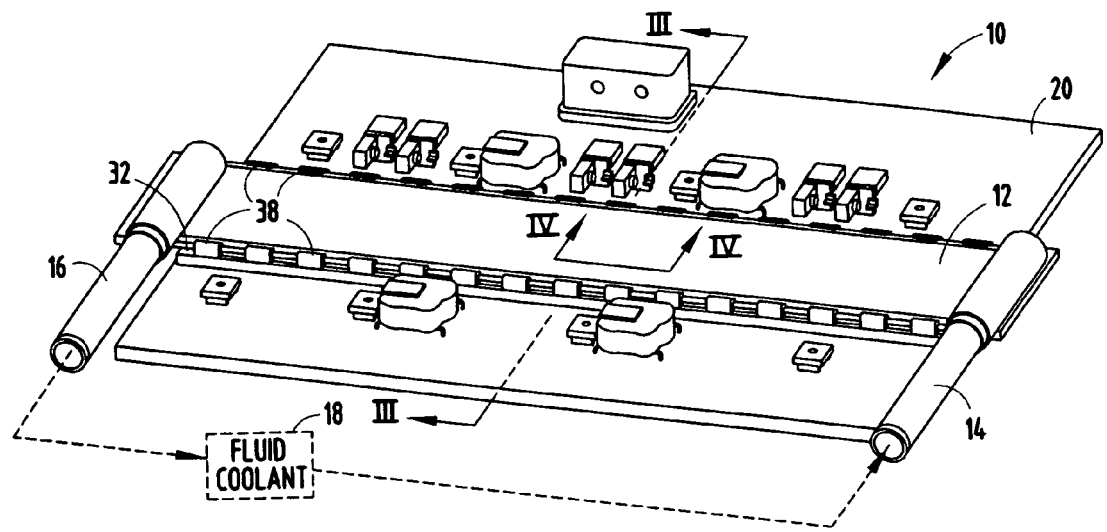
FIG. 1 is a perspective view of an electronics assembly employing a carrier according to the present invention.

Referring to FIGS. 1-5, an electronics assembly 10 is generally illustrated according to one embodiment of the present invention. The electronics assembly 10 includes a substrate 20, such as a printed circuit board, containing electrical circuitry 24 and a plurality of electronics packages (devices) 50 assembled thereto. The electronics assembly 10 also includes a fluid cooling heat sink device 12, also referred to as a heat rail, in thermal communication with the electronics packages 50. Cooling fluid is passed through the heat sink device 12 to dissipate heat away from the top surface of the electronics packages 50.

The substrate 20 may include a printed circuit board, according to one embodiment, shown located generally in a region below the heat sink device 12. The substrate 20 may be made of a low temperature co-fired ceramic (LTCC), an organic material such as FR4, a metal such as stainless steel or any other suitable material. The substrate 20 may have electrical circuitry formed on the top side surface and/or bottom side surface, as well as between laminated intermediate layers of the substrate 20. In the embodiment shown, substrate 20 has electrical circuitry 24 shown in dashed lines and formed on the bottom surface of the substrate 20 for transmitting electrical current.

Assembled onto the printed circuit board 20 are the plurality of electronics packages 50 having electrical circuitry and first side (top) 54 and second (bottom) side 56. The electronics packages 50 generate thermal energy (heat) when conducting electrical current during operation. The electronics packages 50 are generally shown supported by a carrier 30 according to the present invention. More specifically, the electronics packages 50 are generally shown disposed within recessed areas 40 of the carrier 30 and have electrical connecting terminals 52 that extend through openings 39 in the carrier 30 and further into openings 22 in circuit board 20. Openings 39 are formed with tapered walls on opposite ends of recessed areas 40 of carrier 30. Additionally, an opening 34 is formed centrally in recessed areas 40. However, wall 42 could be formed absent openings 34. Terminals 52 may include single or multiple leads that may be soldered, e.g., wave-soldered, to connect to electrical circuitry 24. The electronics packages 50 are thereby electrically and physically connected to circuit board 20 via electrical connecting terminals 52. The terminals 52 may extend all the way through circuit board 20 and may be soldered on the bottom side of the circuit board 20, according to one embodiment.

Each of the electronics packages 50 has a top (upper) side surface 54 exposed to be positioned in thermal communication with the underside of the heat sink device 12. While twenty-two electronics packages 50 are generally shown in the assembly 10 according to one exemplary embodiment, it should be appreciated that one or more electronics packages 50 may be positioned on carrier 30 and cooled in accordance with the teachings of the present invention.

Any of a number of electronics packages 50 may be employed which may include one or more semiconductor devices, such as transistors configured to provide controlled switching operation, operate as a diode, provide voltage regulation, or perform other functions. The electronics packages 50 may be fabricated semiconductor chips, such as flip chips with solder bumps or wire bonded connections that are electrically and/or physically coupled to the substrate 20. Electronics packages 50 may also include resistors, capacitors, field effect transistors (FETS), isolated gate bipolar transistors (IGBTS), and other electrical devices. In a hybrid-electric or electric vehicle application, examples of the electronics package applications may include power inverters, DC-to-DC converters and DC-to-AC converters. Further examples of such electronics packages are disclosed in U.S. Pat. No. 6,812,553, the entire disclosure of which is hereby incorporated herein by reference.

The electronics assembly 10 of the present invention employs a fluid cooled heat exchange device 12 disposed in thermal communication with the upper side of the electronics packages 50. The heat sink device 12 is shown disposed on the top side surface 54 of electronics packages 50. The fluid cooled heat sink device 12 operates to dissipate thermal energy (heat) away from the electronics packages 50 for purposes of cooling the corresponding electronics packages 50.

The fluid cooled heat sink device 12 is configured having a fluid receiving vessel for receiving cooling fluid according to the embodiment shown. According to one exemplary embodiment, the heat sink device 12 may employ a stamping/brazing construction having a fluid vessel with fin inserts such as is disclosed in U.S. Pat. No. 6,639,798, the entire disclosure of which is hereby incorporated herein by reference. According to this exemplary construction, the heat sink device 12 may have a fluid vessel constructed utilizing upper and lower containment plates joined by a brazing process to form the fluid vessel. Other heat sink devices 12 may be utilized.

Hose barb fluid fittings 14 and 16 may be formed on the heat sink device 12. Hose barb fluid fitting 14 is utilized as an inlet port to facilitate easy connection to a hose to receive fluid coolant from a fluid coolant source 18. Hose barb fluid fitting 16 is utilized as an outlet port to facilitate easy connection to a hose to pass cooling fluid back to the fluid coolant source 18. Accordingly, cooling fluid passes from source 18 into inlet port 14 through the cooling vessel, and out the outlet port 16. The fluid coolant may then pass through a cooling radiator (not shown), such as an automotive vehicle radiator, before returning to the fluid coolant source 18.

The heat sink device 12 may include any of a number of internal fluid coolant flow configurations to enhance heat exchange. In one embodiment, one or more fin inserts may be formed within the fluid vessel such as is disclosed in U.S. Pat. No. 6,639,798. Fin inserts may serve to stir up fluid coolant flowing through the fluid vessel as well as multiply its internal wetted surface area.

Disposed between the bottom side surface 56 of at least a portion of the electronics packages 50 and the top side surface of circuit board 20 are thermally conductive copper slugs 60. The copper slugs 60 provide a thermal conductive medium across a substantial portion of the bottom surface of each electronic package 50. In doing so, thermal energy is redirected via slugs 60 across the bottom of the electronics devices 50. At least some of the redirected thermal energy is then dissipated back up through other portions of the electronics packages 50. The copper slugs 60 may be adhered or otherwise attached onto the bottom surface 56 of electronics packages 50 and/or upper surface of circuit board 20.

The electronics assembly 10 of the present invention employs a carrier 30 that allows the electronics packages 50 to be located in a known controlled geometry, particularly prior to the final assembly, to eliminate the package height variability with respect to the heat sink device 12. The carrier 30 is a polymeric (plastic) carrier, according to one embodiment. The carrier 30 includes a frame 32 defining a plurality of a recessed areas 40 and openings 34 and 39 formed in the recessed areas 40. Each recessed areas 40 receives an electronics package 50. A single carrier 30 is shown having twenty-two recessed areas 40 for receiving twenty-two corresponding electronics packages 50 in the exemplary embodiment. However, it should be appreciated that one or more carriers 30 may be employed to accommodate any number of one or more electronics packages 50.

Figure 5:
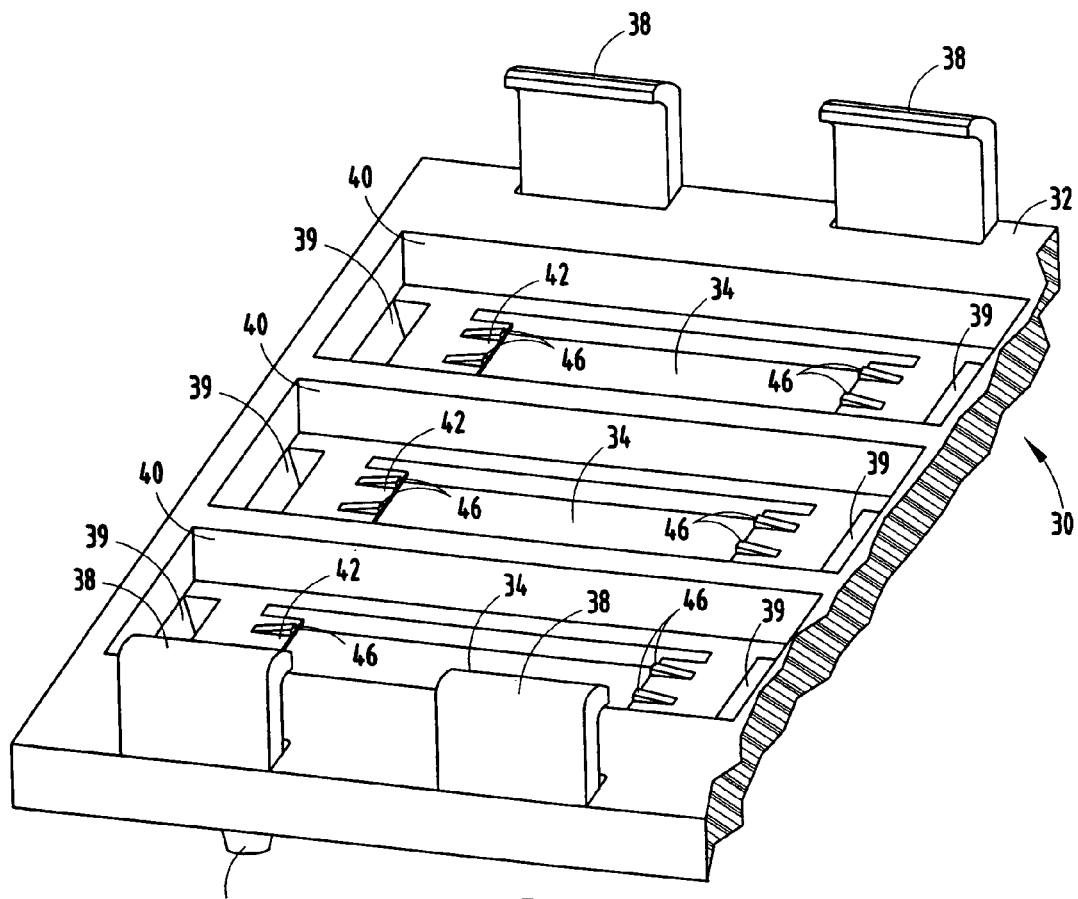
FIG. 5 is an enlarged top perspective view of a portion of the carrier.
Figure 2:
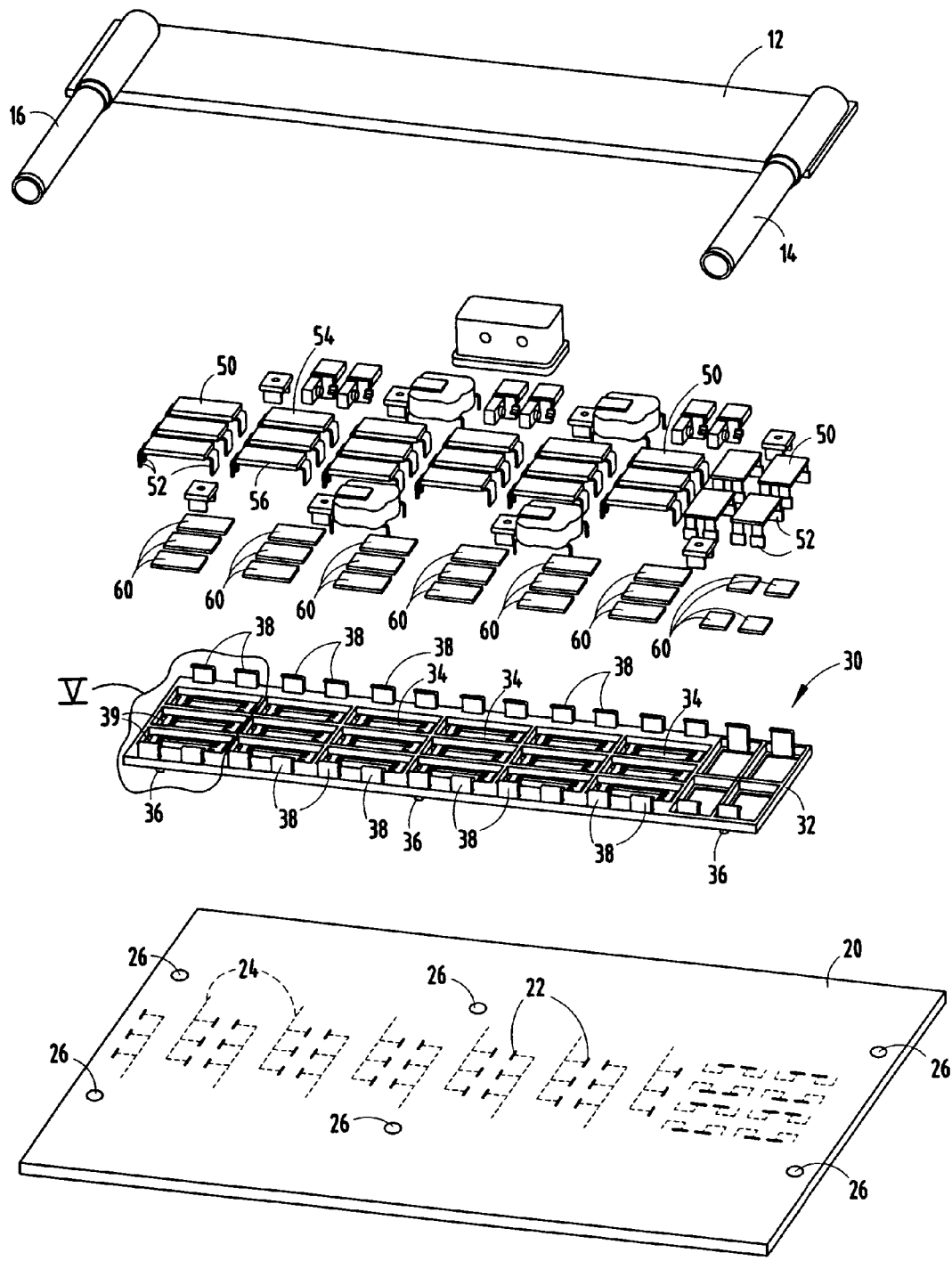
FIG. 2 is a perspective exploded view of the electronics assembly shown in FIG. 1.
Figure 3:
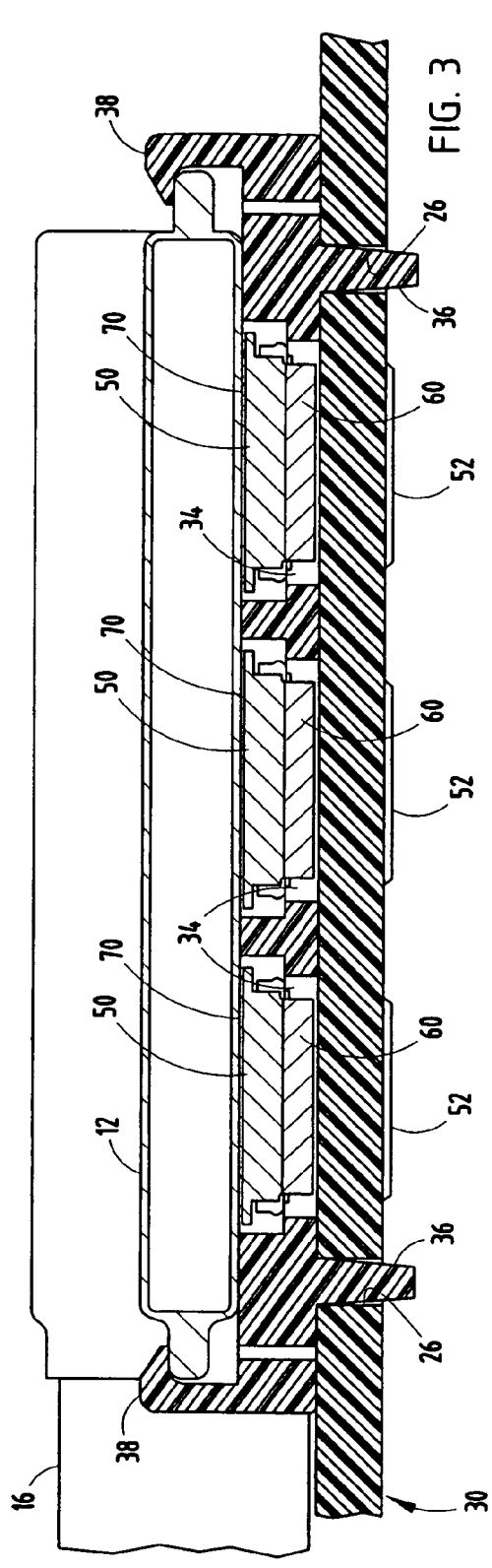
FIG. 3 is a cross-sectional view of the electronics assembly taken through line III-III in FIG. 1.
Figure 4:
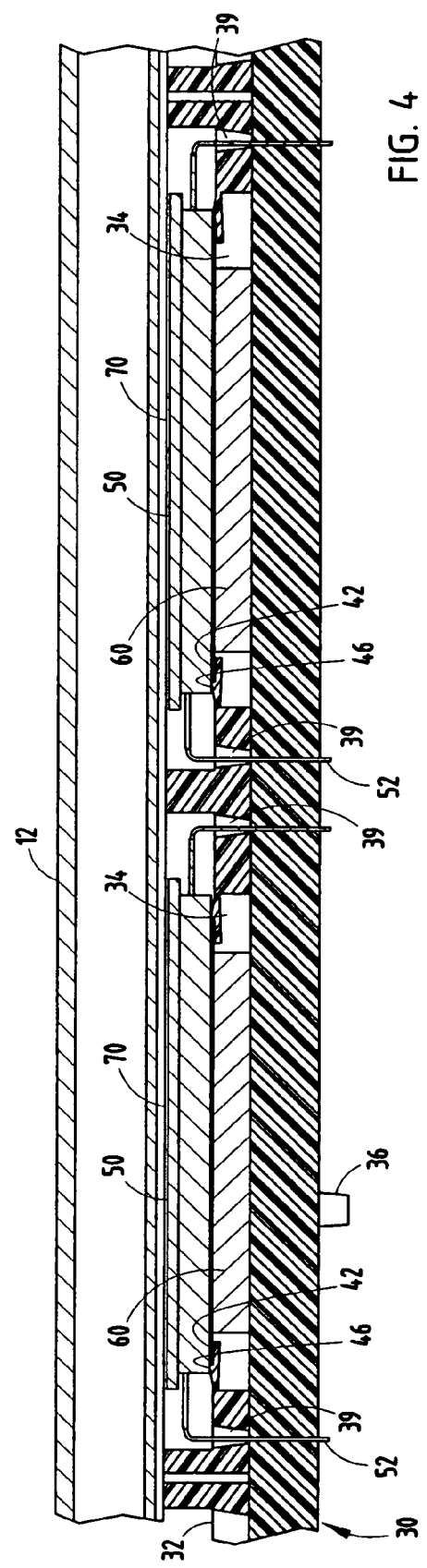
FIG. 4 is a cross-sectional view of the electronics assembly taken through line IV-IV in FIG. 1.

Referring particularly to FIG. 5, the carrier 30 is illustrated in detail having walls defining the recessed areas 40 for receiving individual electronics packages 50. The openings 39 are formed with tapered walls that allow for easy alignment of the electronics package leads 52. Additionally, the tapered walls defining openings 39 prevent lateral movement of the electronics packages 50, that is movement in either of the X- and Y-axes, within a nominal tolerance.

The carrier 30 includes thin plastic resilient walls 42 formed on opposite sides of the recessed areas 40. The thin resilient walls 42 provide bottom walls that flex vertically in the upward and downward direction (i.e., Z-axis) to form a spring bias in the vertical direction. Formed on top of the thin bottom walls 42 are fingers 46 that are adapted to contact the bottom surface of electronics packages 50. The fingers 46 contact the electronics packages 50 and, with a spring bias of the thin bottom wall 42, apply pressure to the corresponding individual electronics package 50 to force the electronics packages 50 into thermal communication with heat sink device 30 such that a controlled bond line is provided between the top side of the electronics packages 50 and the bottom side of the heat sink device 30. While two fingers 46 are shown on each of the opposite ends of the thin bottom resilient walls 42, it should be appreciated that one or more fingers may be employed on each end.

The plastic carrier 30 thereby allows for the electronics packages 50 to have movement in the vertical (Z-axis) direction while constraining the motion in the lateral (X- and Y-axes) directions. When the plastic carrier 30 is clamped to the heat sink device 12, the flexible fingers 46 supply a known Z-axis force against discrete electronics packages 50. This force pushes the discrete electronics packages 50 upwards in the vertical Z-axis direction against the heat sink device 30.

Additionally, a thermally conductive medium 70 may be disposed between the bottom side surface of the heat sink device and the top side surface of the electronics packages 50. The thermally conductive material 70 may include a thermal adhesive, according to one embodiment. The thermal adhesive 70 creates a known bond line that can be established because of the force applied by the carrier 30 to the electronics packages 50 to control and maintain a controlled bond line.

The carrier 30 also includes a plurality of upstanding tabs 38 formed near the perimeter on opposite sides of the frame 32. The upstanding tabs 38 each having a lip that extends laterally inward on its upper end to engage a structure of the electronics assembly 10. Specifically, tabs 38 flex and adapted to clamp onto the peripheral edge on opposite sides of the heat sink device 30. Accordingly, the tabs 38 allow the carrier 30 to clamp onto heat sink device 12 such that electronics packages 50 are biased between the carrier 30 and heat sink device 12.

The carrier 30 further includes a plurality of locating pins 36 formed extending from the bottom side of the carrier 30. The locating pins 36 have tapered walls in the shape of a frustum and are adapted to engage openings 26 formed in the circuit board 20. The locating pins 36 allow the carrier 30 to be precisely located on circuit board 20, specifically prior to wave-soldering or reflow and any further process steps.

By employing the plastic carrier 30, according to the present invention the discrete electronics packages 50 can be assembled to the heat sink device 12. Plastic carrier 30 allows adhesive material 70 to be cured with a known bond line between discrete electronics package(s) 50 and to the heat sink device 12. After the discrete electronics packages 50 are assembled to the heat sink device 12, the partially-assembled assembly can then be soldered to the circuit board 20 using the locating pins 36 to align the partially assembled assembly to the circuit board 20. As an option, the copper slugs 60 can be disposed between electronics packages 50 and circuit board 20 to further improve the thermal performance of the electronics assembly 10. In doing so, copper slugs 60 extend through openings 34 in carrier 30 and are dielectrically isolated from terminals 52.

Accordingly, by controlling the variation between the heat sink device 12 and the electronics packages 50, a maximum bond line is ensured and a known thermal performance of the electronics assembly 10 can be achieved. By further adding the copper slugs 60 to one side of the electronics packages 50 further enhances the thermal performance of the power electronics packages 50. Additionally, the tabs 38 as well as the locating pins 36 assure that mounting to other subsystems can be easily accomplished. While a single fluid cooling heat sink device 12 is shown and described herein, it should be appreciated that one or more heat sink devices may be employed to cool one or more surfaces of the electronics packages 50 employing the carrier 30 according to the present invention.

By enhancing the heat dissipation, particularly for high-powered electronics packages 50, the electronics assembly 10 advantageously allows for the reduction in the number and/or size of electronics packages 50 used in the assembly 10, or allows for an increase in inlet coolant temperatures, thereby reducing the size and cost of the overall assembly 10. Additionally, the enhanced heat dissipation achieved by employing the carrier 30 of the present invention may allow for an increase in the power output of the electronics packages 50 and circuit board 20, thereby improving the overall performance of the electronics assembly 10. These and other advantages may be achieved by the novel assembly and cooling design of the present invention.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. An electronics assembly comprising:
    a substrate;
    at least one electronics package connected to the substrate, said electronics package comprising electrical circuitry and first and second sides;
    a heat sink device positioned in thermal communication with the first side surface of the electronics package; and
    a carrier disposed between the substrate and the heat sink device, said carrier comprising a resilient wall for biasing the electronics package towards the heat sink device such that a controlled bond line is provided between the first side of the electronics package and the heat sink device, wherein the carrier further comprises a plurality of fingers formed in the resilient wall that bias the electronics package towards the heat sink device.

2. The electronics assembly as defined in claim 1 further comprising a thermal conductive medium disposed between the first side of the electronics package and the heat sink device.

3. The electronics assembly as defined in claim 2, wherein the thermal conductive medium comprises a thermal conductive adhesive.

4. The electronics assembly as defined in claim 1, wherein the heat sink device comprises a fluid vessel for receiving a cooling fluid.

5. The electronics assembly as defined in claim 1, wherein the electronics assembly is employed on a vehicle.

6. The electronics assembly as defined in claim 1, wherein the substrate comprises a circuit board having electrical circuitry.

7. The electronics assembly as defined in claim 1, wherein the carrier comprises a polymeric carrier having a frame generally defining a recessed area that allows the electronics package to move in a direction normal to the substrate and the heat sink device, while constraining movement of the electronics package in other directions.

8. The electronics assembly as defined in claim 1, wherein the carrier comprises tabs for engaging a surface on the heat sink device.

9. The electronics assembly as defined in claim 1, wherein the substrate comprises openings, and the carrier comprises locating pins that engage the openings.

10. The electronics assembly as defined in claim 1, wherein the electronics assembly comprises a plurality of electronics packages and the carrier comprises a plurality of recessed areas for engaging the electronics packages.

11. The electronics assembly as defined in claim 1 further comprises a thermal conductive pedestal disposed between the substrate and the at least one electronics package.

12. An electronics package carrier for use in an electronics assembly, said carrier comprising:

a frame generally defining at least one area for receiving an electronics package, wherein the electronics package connects to a substrate on a first side and is in thermal communication with a heat sink device on the opposite second side;

a resilient wall formed at the at least one area for biasing the electronics package towards a heat sink device;

connecting members adapted to engage a member of the electronics assembly to hold the electronics package in a desired orientation relative to the heat sink device such as to provide a controlled bond line; and wherein the connecting members comprising a plurality of upstanding fingers formed on the resilient wall to contact the electronics package.

13. The carrier as defined in claim 12, wherein the carrier comprises a polymeric material.

14. The carrier as defined in claim 12, wherein the connecting members comprise tabs located near opposite sides of the carrier.

15. The carrier as defined in claim 14, wherein the tabs are adapted to engage the heat sink device.

16. The carrier as defined in claim 12, wherein the carrier comprises a recessed area that allows movement of the electronics package in a direction between the substrate and the heat sink device, while constraining motion in other directions.

17. The carrier as defined in claim 12 further comprising locating pins formed on one side of the frame to allow the carrier to be located on the substrate.

18. The carrier as defined in claim 12, wherein the frame defines a plurality of recessed areas for receiving a plurality of electronics packages.

* * * * *